(12) United States Patent
Liaw

(10) Patent No.: US 7,586,147 B2
(45) Date of Patent: Sep. 8, 2009

(54) BUTTED SOURCE CONTACT AND WELL STRAP

(75) Inventor: Jhon-Jhy Liaw, Shin Chu (TW)

(73) Assignee: Taiwan Semiconductor Manufacturing Co. Ltd., Hsin-Chu (TW)

( * ) Notice: Subject to any disclaimer, the term of this patent is extended or adjusted under 35 U.S.C. 154(b) by 246 days.

(21) Appl. No.: 11/405,102

(22) Filed: Apr. 17, 2006

(65) Prior Publication Data

US 2007/0243671 A1 Oct. 18, 2007

(51) Int. Cl.
H01L 21/00 (2006.01)

(52) U.S. Cl. .................................. 257/327; 257/343

(58) Field of Classification Search .............. 257/369, 257/371, 327, 337–339, 343, 347
See application file for complete search history.

(56) References Cited

U.S. PATENT DOCUMENTS

| 4,530,150 | A | 7/1985 | Shirato |
| 4,962,052 | A | 10/1990 | Asayama et al. |
| 6,686,247 | B1 | 2/2004 | Bohr |
| 2003/0211730 | A1 | 11/2003 | Park |

Primary Examiner—Richard A. Booth
(74) Attorney, Agent, or Firm—Tung & Associates

(57) ABSTRACT

A butted contact structure forming a source contact electrically connecting a voltage node and a well region and method for forming the same, the butted contact structure including an active region having a well region disposed adjacent an electrical isolation region on a semiconductor substrate; a MOSFET device including a source and drain region on the active region; and, a conductive contact having a first portion formed to the source region and a second portion formed through the electrical isolation region to the doped well region.

20 Claims, 4 Drawing Sheets

BUTTED SOURCE CONTACT AND WELL STRAP

FIELD OF THE INVENTION

This invention generally relates to semiconductor processing methods for forming contacts in a multilevel semiconductor device and more particularly a method for forming an improved well strap contact in a low power semiconductor logic and memory devices.

BACKGROUND OF THE INVENTION

As sizes of logic circuits and memory devices decreases together with a decrease in the operating Voltages, a decreasing amount of charge is stored in MOSFET devices and memory cells. For example in ultra low power devices, for example a static random access memory device (SRAM), requires periodic refresh signals to retain stored data where the ratio of standby current (Isb) to drive current (Idr) is a critical design parameter in low power devices to enable proper functioning.

Another increasingly important performance and reliability problem in logic and memory devices as device sizes decrease is the problem of latchup in logic devices and error rates in memory devices, also referred to as a soft error rate (SER). Latchup and SER may be caused by alpha ray or cosmic rays, for example the cosmic rays secondarily producing neutrons in the atmosphere, that create undesirable electrical charges (electron/hole pairs) upon passing through or near the device. The alpha or cosmic ray produced charge interferes with the proper functioning of a logic or memory device, for example static random access memory (SRAM) or dynamic random access memory (DRAM) devices. For example it has been found that advanced SRAM devices are more susceptible to cosmic ray induced errors.

In SRAM memory cells, for example, straps (electrical ties) may be periodically included in memory cell arrays to tie a source line to well region so as to create equivalent voltages thereby increasing device stability. For example, a well region potential may become unstable if there is any leakage current in the well region. An unstable well potential can correspondingly produce undesirable threshold or sub-threshold voltage instability. Therefore, the straps improve the voltage stability of the memory cells formed in the well region (e.g., P-well or N-well).

A strap may be included periodically in memory cell arrays to provided well stability, for example every 4, 16, 32 etc. cells. One problem with fewer straps is an increase in the SER. On the other hand, increasing the number of straps necessarily increases the size of the memory cell.

There is therefore a need in the semiconductor device processing art for a semiconductor device and method for forming the same whereby the size of the device may be reduced while improving device reliability performance.

It is therefore an object of the present invention to provide a semiconductor device and method for forming the same whereby the size of the device may be reduced while improving device reliability and performance, in addition to overcoming other shortcomings of the prior art.

SUMMARY OF THE INVENTION

To achieve the foregoing and other objects, and in accordance with the purposes of the present invention, as embodied and broadly described herein, the present invention provides a butted contact structure forming a source contact electrically connecting a voltage node and a well region and method for forming the same.

In a first embodiment, the butted contact structure includes an active region having a well region disposed adjacent an electrical isolation-region on a semiconductor substrate; a MOSFET device including a source and drain region on the active region; and, a conductive contact having a first portion formed to the source region and a second portion formed through the electrical isolation region to the doped well region.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the method of the present invention is explained with reference to and is particularly advantageously implemented in forming low power MOSFET devices and static random access memory (SRAM) devices, it will be appreciated that the method of the present may be advantageously used to improve the performance of logic and memory devices in general, including reducing a soft error rate (SER), reducing latchup, improving device stability, reducing sub-threshold current leakage, and reducing bipolar coupling effects. In addition, the present invention reduces a required active area to allow each active area well region to be electrically tied by a well strap to a respective voltage node.

Figure 1:
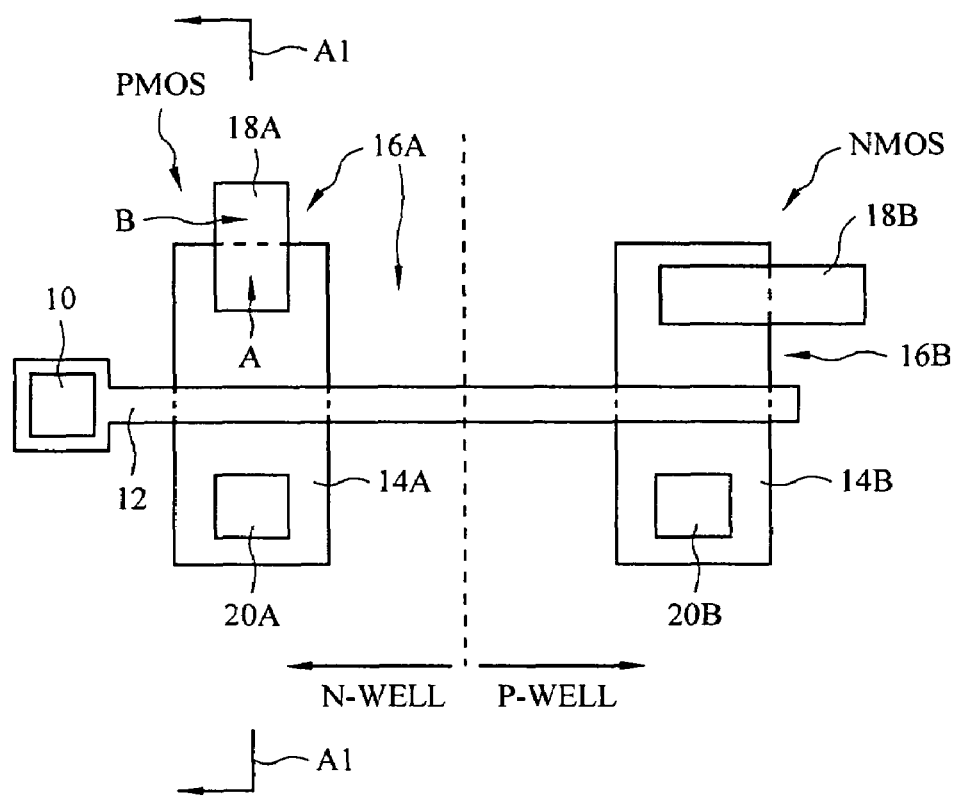
FIG. 1 shows a contact layout structure according to an embodiment of the present invention.

In an exemplary embodiment of the present invention, reference is made to FIG. 1 where a top planar view of a portion of a contact structure (contact layout) of PMOS and NMOS active regions (e.g., bipolar device) of a memory cell array is shown. For example, shown is gate contact region 10 communicating with extended gate structure 12 which extends over a PMOS active region 14A formed overlying an N-well region in the semiconductor substrate, and an NMOS active region 14B formed overlying a P-well region. On either side of the gate structure in each respective active region e.g., 14A and 14B, are source contacts e.g., 18A, 18B, partially formed over source regions and partially formed over adjacent isolation regions, generally shown as 16A and 16B areas (e.g., surrounding respective active areas). Also shown are conventional drain contacts e.g., 20A and 20B formed over drain regions in the semiconductor substrate.

In an important aspect of the invention, the source contacts 18A and 18B include butted portions that partially overlap and extend through a thickness portion of the electrical isolation regions e.g., 16A and 16B adjacent the active regions 14A and 14B, to form well straps (electrical ties) electrically connecting a respective well region and a respective voltage node (not shown), Vcc or Vss, which also provides a voltage signal to the source region 18A. For example, the contacts 18A and 18B are formed to include a having a first portion e.g., A extending a first depth through an overlying ILD layer (not shown) to make electrical contact with source regions, and a second portion e.g., B extending to a second depth greater than the first depth through a thickness of an adjacent electrical isolation region to make electrical contact, preferably ohmic contact, to a respective well region e.g., N-well region including active area 14A and P-well region including active area 14B. It will be appreciated that the electrical isolation regions e.g., generally shown as areas 16A and 16B adjacent the active regions, may be a field oxide region including LOCOS or shallow-trench isolation (STI) structures, more preferably STI structures.

The butted contacts e.g., 18A and 18B, may have a contact layout (e.g., top-planar view) including any shape, preferably square or rectangular, and may extend in any horizontal direction to overlap adjacent isolation regions e.g., 16A and 16B. For example, exemplary and preferred embodiments show butted contact e.g., 18A, extending to overlap adjacent isolation regions in a direction parallel to the major axis of the active area, and butted contact, e.g., 18B, extending parallel to a minor axis of the active area. The butted contacts may be formed with varying lengths including forming a straight or folded line shaped structure such as a local interconnect structure. The butted contact portion B preferably extends a sufficient depth through the electrical isolation region to make ohmic contact with a respective well region associated with an active area in the semiconductor substrate. For example, preferably the butted portion of the contact extends a depth from about 200 Angstroms to about 3000 Angstroms deeper than the portion A, depending on the type and geometry of the isolation region. It will also be appreciated that the butted contacts 18A and 18B extend upward to provide electrical interconnection between the active region and overlying wiring including voltage nodes formed in metallization layers (not shown).

Figure 2A:
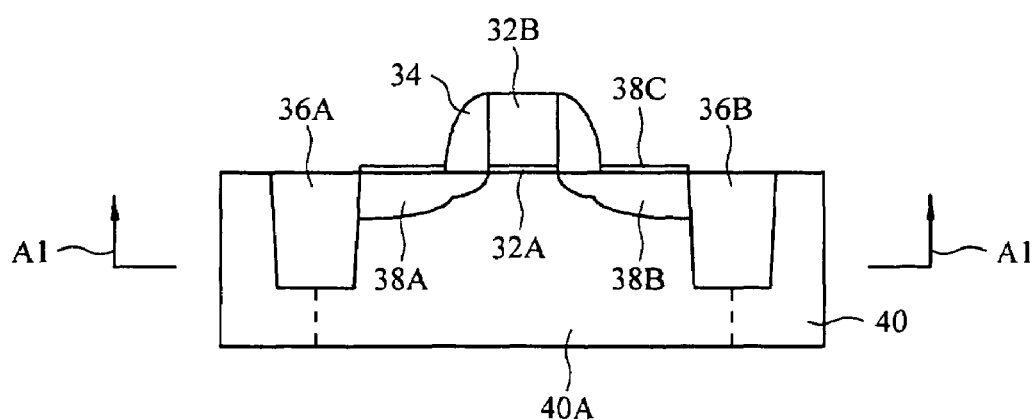
FIGS. 2A-2E are cross-sectional vies showing exemplary manufacturing steps according to an embodiment of the present invention.

Referring to FIG. 2A is shown an exemplary cross sectional view of a semiconductor device, for example viewing a cross section through line Al shown in the contact layout in FIG. 1. Shown is a conventional MOSFET (P or N polarity) device formed by conventional processes, including a gate electrode 32B overlying a gate dielectric 32A, and having sidewall spacers e.g., 34, formed adjacent either side of the gate structure. Also shown are STI structures 36A and 36B formed adjacent to a drain region 38A and a source region 38B. The STI structures are formed by conventional processes including forming a trench, e.g., optionally having sloped sidewalls (e.g., >83 deg) in semiconductor substrate 40, followed by backfilling with an insulating dielectric such as silicon oxide, followed by planarization. Semiconductor substrate 40 includes a doped well (P or N) region e.g., 40A which underlies the active region) including the gate structure and adjacent source and drain regions and may partially extend underneath the isolation regions. Drain region 38A and source region 38B are formed by conventional implant processes to form doped LDD or source drain extension (SDE) regions adjacent the gate structure prior to sidewall spacer formation and outlying adjacent higher doped regions following sidewall spacer formation.

Conventional process may be carried out to optionally form self-aligned metal silicide regions e.g., 38C over the source/drain regions and/or the gate electrode regions (not shown), for example including $TiSi_2$, $CoSi_2$, $NiSi$, $WSi_2$, and PtSi.

Figure 2B:
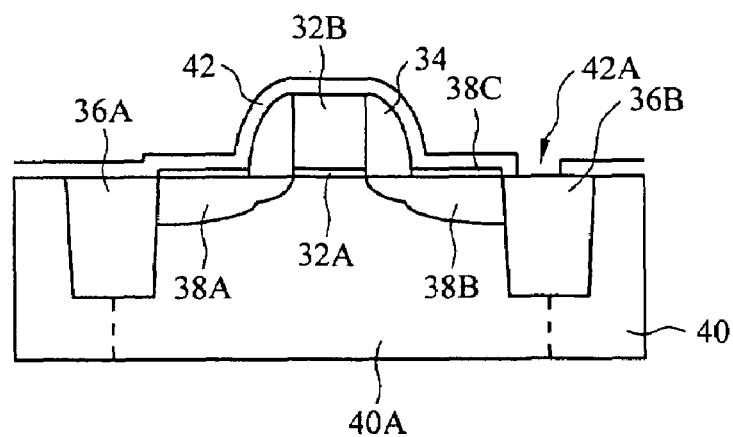

Referring to FIG. 2B, according to an embodiment of the present invention a first dielectric layer (contact etch stop layer) 42 may optionally be formed over the process surface prior to forming an overlying ILD layer. The contact etch stop layer may be formed of single material or may be formed of a composite of materials. For example, the contact etch stop layer may include a nitrogen and/or oxygen containing dielectric such as one or more of SiON, $Si_3N_4$, SiN, or high-K dielectric (K>5).

Still referring to FIG. 2B, prior to depositing an overlying ILD layer, the contact etch stop layer 42 may optionally be subjected to first lithographic patterning and etch process, e.g., a reactive ion etch (RIE) process to remove a portion e.g., 42A of the first dielectric layer 42 overlying STI structure 36B adjacent the source region 38B. The lithographic process may include an illumination wavelength below 100 nm and the resist thickness may be 0.5 microns in thickness to about 1.0 micron in thickness. It will be appreciated that higher illumination wavelengths and other resist thicknesses may be used as well. The lithographic patterning process may additionally include first forming a bottom anti-reflectance coating (BARC) layer either organic or inorganic, and/or forming a hardmask layer (underlying the BARC layer) on the first dielectric layer prior to resist layer formation and patterning, similar to the ILD layer lithographic patterning scheme shown below. An anisotropic etching process (e.g., RIE) is then carried out to remove portion e.g., 42A of the contact etch stop layer 42 overlying the STI structure 36B.

Figure 2C:
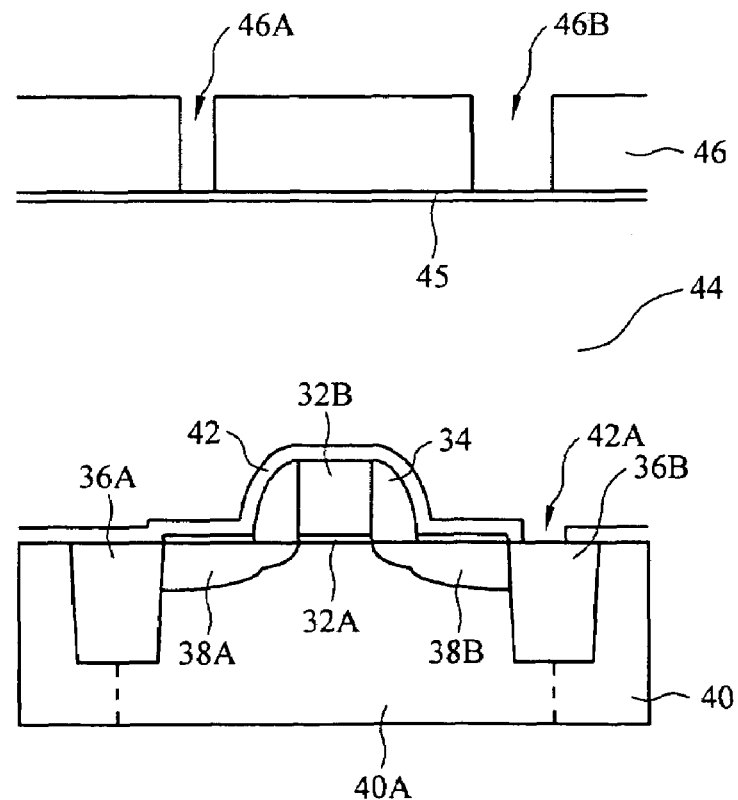

Referring to FIG. 2C, a second dielectric layer 44, also referred to as an ILD layer is then formed over the contact etch stop layer 42. The ILD layer may be formed of one or more of an oxygen containing dielectric, a nitrogen containing dielectric, a fluorine containing dielectric, for example including one or more of SiON, $Si_3N_4$, PSG, BSG, BPTEOS, BPSG, PETEOS, PEOX, low-k dielectric (K<3.1), and high-K dielectric (K>5). As noted in parentheses, the term 'low-K' means a dielectric constant of less than about 3.1 and the term 'high-K' means a dielectric constant of greater than about 5.0. It will be appreciated that the ILD layer 44 may be formed without first forming the contact etch stop layer 42. A second lithographic patterning process is then carried out to form contact opening patterns e.g., 46A and 46B in a resist layer e.g., 46, formed overlying the ILD layer 44. The lithographic pattern process may include first forming a bottom anti-reflectance coating (BARC) layer (organic or inorganic) and/or a hardmask layer, shown generally as 45 on the ILD layer 44 prior to forming and patterning the resist layer 46.

Figure 2D:
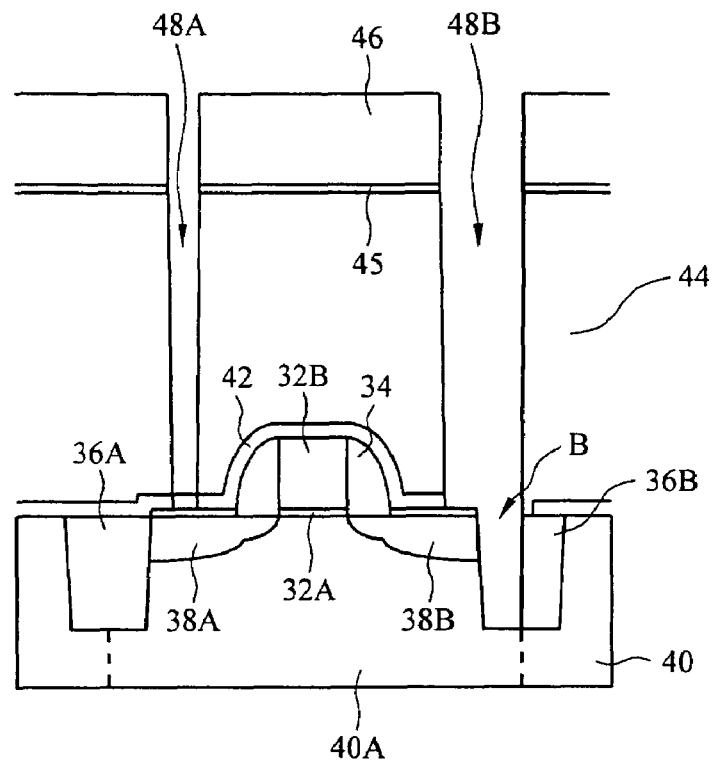

Referring to FIG. 2D, anisotropic RIE etching is then performed to etch contact openings 48A and 48B in a multi-step etching process to form contact openings to the source and drain regions, e.g., stopping on the contact etch stop layer 42, if present. A second etching step is then performed to etch through a thickness portion of the STI structure (e.g., underlying uncovered portion 42A) to expose the well region portion e.g., 40A. During the second etching process, the contact etch stop layer 42 may be fully or partially removed overlying the source and drain regions. Although, the exemplary embodiment shows completely etching through a depth of the STI structure, it will be appreciated that the sidewalls of the STI structure 36B may be slanted inward from the top to the bottom portion (e.g., greater than 83 deg from vertical), causing the butted portion B of the contact opening 48B to penetrate the sidewalls at a selected depth less than the full depth of the STI structure, the depth depending on the angle of the slanted sidewalls. It will also be appreciated that the contact openings may be formed with slanted sidewalls.

Figure 2E:
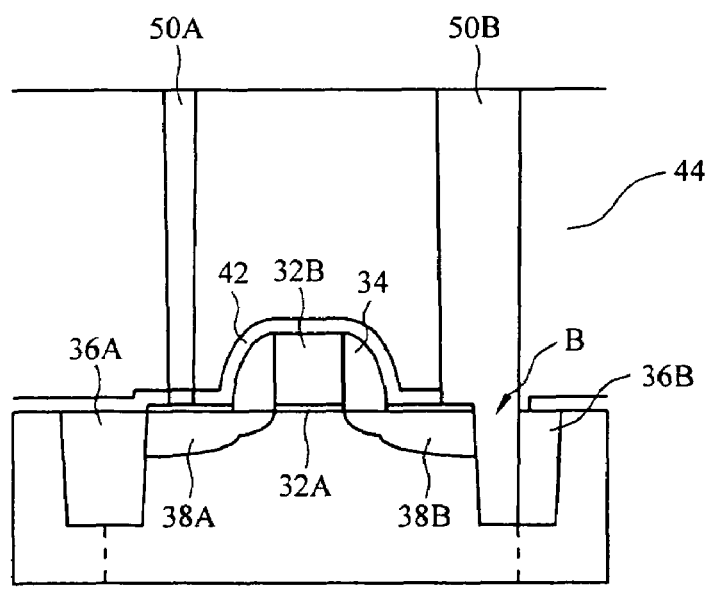

Referring to FIG. 2E, the contact openings 48A and 48B are then backfilled with a conductor material by conventional processes to form conductive contacts 50A an 50B, followed by planarization if necessary. A conductive contact interface may first be formed to line the contact openings, or be formed only at a contact area portion, prior to backfilling with a conductive material. The conductive contact interface portion may be formed of one or more of a semiconductor, refractory metal, refractory metal nitride, metal, metal silicide, such as TiN, TiW, Ta, TaN, W, WN, WSi$_2$, Ti, TiSi$_2$, Co, CoSi$_2$, Ni, NiSi, Pt, PtSi, and Si. The conductive contact material may be formed of one or more of a refractory metal, refractory metal nitride, metal, and metal silicide, for example Cu, W, Al, AlCu, TiSi$_2$, Co, CoSi$_2$, Ti, TiN, TiW, Ta, TaN, Ni, and NiSi.

Figure 3:
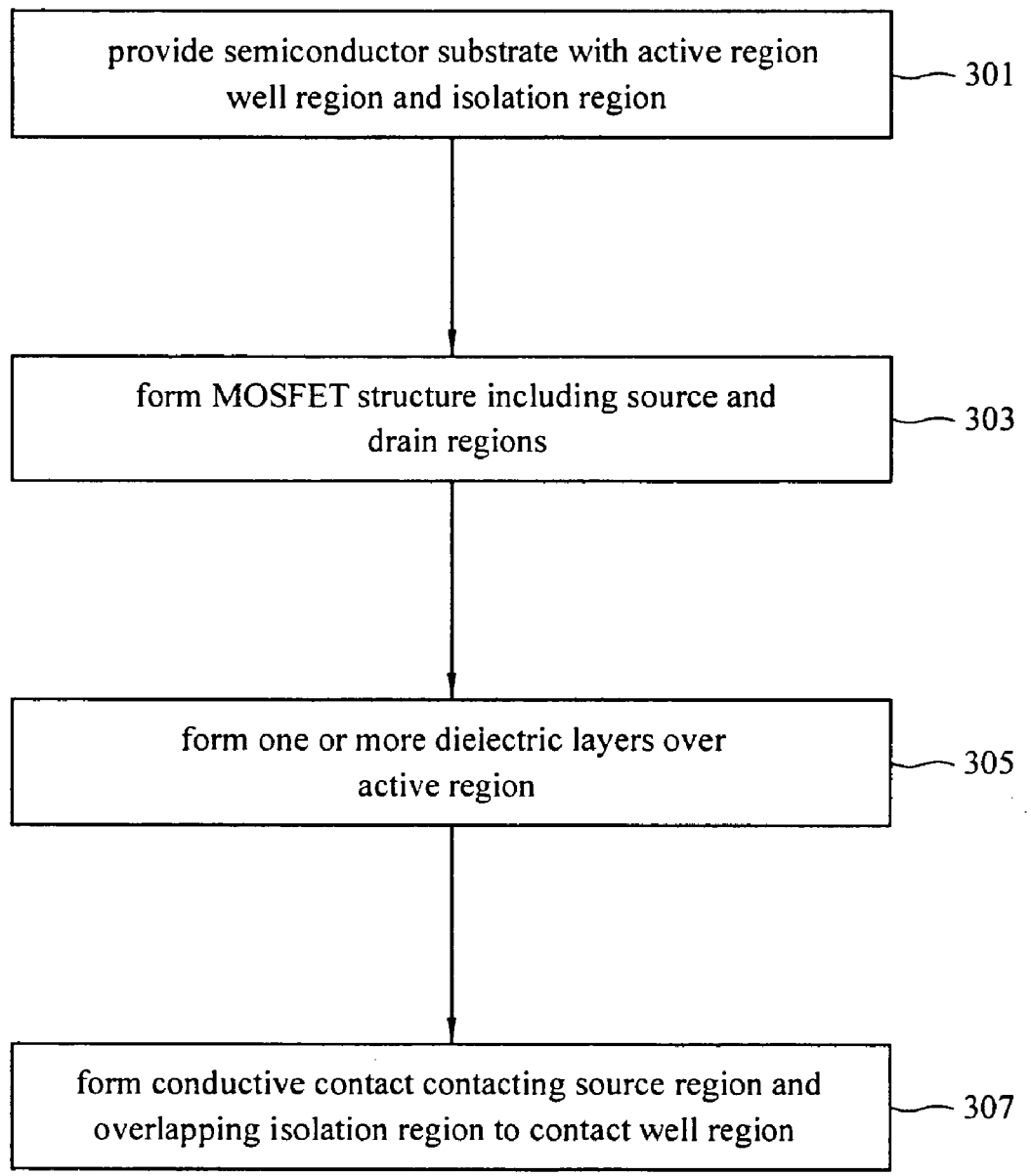
FIG. 3 is a process flow diagram including several embodiments of the present invention.

In FIG. 3 is shown a process flow diagram including several embodiments of the present invention. In process 301, a semiconductor substrate is provided having an active region including a doped well region and an isolation region adjacent the active region. In process 303, a MOSFET is formed having a source and drain region. In process 305 one or more dielectric layers including an ILD layer is formed over the active region and isolation region. In process 307, a conductive contact is formed overlapping the source region and the isolation region having a first portion contacting the source region and a second portion extending through the isolation region to contact the well region to form a source contact and a well strap tied to a voltage node.

Thus, a structure and method for forming the same has been presented to form a butted contact forming both a source region contact and a well strap. Advantageously, according to the present invention the butted contacts decrease the required active area where separate well straps are formed as in prior art contact layout schemes, thereby allowing formation of well straps to each active region e.g., including each PMOSFET and/or NMOSFET active area in a semiconductor device or memory cell. The present invention additional enables improved device performance and reliability. For example, the soft error rate (SER) and latchup is reduced by supplying well straps in each MOSFET device or memory cell, e.g., one strap for each Vcc or Vss contact, thereby improved device stability and reliability. The contact layout structure including butted well straps of the present invention further provides a lower effective well resistance and decreased well strap length compared to prior art contact layout structures, thereby reducing subthreshold current leakage, improving device on current, and reducing bipolar transistor coupling effects.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A contact structure comprising:
an active region comprising a well region disposed adjacent an electrical isolation region on a semiconductor substrate;
a MOSFET device comprising a source and drain region on the active region; and,
a conductive contact comprising a first portion extending to the source region and a second portion extending through the electrical isolation region to the doped well region, said conductive contact having a greater width than a conductive contact extending to said drain region, said conductive contact comprising a well strap electrically tied to a voltage node.

2. The contact structure of claim 1, wherein the electrical isolation region comprises a shallow trench isolation (STI) structure or SOI.

3. The contact structure of claim 1, wherein the second portion, is butt contacted to the first portion to form a well strap.

4. The contact structure of claim 1, wherein the second portion extends to a depth greater than the first portion.

5. The contact structure of claim 4, wherein the depth is greater by about 200 Angstroms to about 3000 Angstroms.

6. The contact structure of claim 1, wherein the active region comprises a memory cell or memory cell array.

7. The contact structure of claim 1, wherein the conductive contact forms ohmic contact with the well region.

8. The contact structure of claim 1, wherein the well region comprises an N-well and the conductive contact electrically ties the N-well and a Vcc node.

9. The contact structure of claim 1, wherein the well region comprises a P-well and the conductive contact electrically ties the P-well and a Vss node.

10. The contact structure of claim 1, wherein the well region comprises one of a plurality of well regions wherein each of the plurality of well regions comprises a respective one of the conductive contacts electrically connecting a respective well region to a respective voltage node.

11. A contact structure comprising:
a semiconductor substrate;
an electrical isolation region comprises a shallow trench isolation (STI) structure or SOI on said semiconductor substrate;
an active region comprising a well region disposed adjacent said electrical isolation region;
a MOSFET device comprising a source and drain region on the active region; and,
a conductive contact comprising a first portion extending to the source region and a second portion extending through the electrical isolation region to said well region, said conductive contact having a greater width than a conductive contact extending to said drain region, said conductive contact comprising a well strap electrically tied to a voltage node.

12. The contact structure of claim 11, wherein the second portion is butt contacted to the first portion to form said well strap.

13. The contact structure of claim 11, wherein the second portion extends to a depth greater than the first portion.

14. The contact structure of claim 13, wherein said depth is greater by about 200 Angstroms to about 3000 Angstroms.

15. The contact structure of claim 11, wherein said active region comprises a memory cell or memory cell array.

16. The contact structure of claim 11, wherein said conductive contact forms ohmic contact with the well region.

17. The contact structure of claim 11, wherein said well region comprises an N-well and said conductive contact electrically ties the N-well and a Vcc node.

18. The contact structure of claim 11, wherein said well region comprises a P-well and said conductive contact electrically ties the P-well and a Vss node.

19. The contact structure of claim 11, wherein said well region comprises one of a plurality of well regions wherein each of the plurality of well regions comprises a respective one of said conductive contacts electrically connecting a respective well region to a respective voltage node.

20. A contact structure comprising:
a semiconductor substrate;
an electrical isolation region comprises a shallow trench isolation (STI) structure or SOI on said semiconductor substrate;
an active region comprising a well region disposed adjacent said electrical isolation region, said well region comprises at least one N-well or P-well;
a MOSFET device comprising a source and drain region on the active region; and, a conductive contact comprising a first portion extending to the source region and a second portion extending through the electrical isolation region making ohmic contact to said well region, said second portion is butt contacted to said first portion and extends to a depth greater than said first portion, said conductive contact having a greater width than a conductive contact extending to said drain region, said conductive contact comprising a well strap electrically tied to a voltage node.

* * * * *